(12) United States Patent
Song et al.

(10) Patent No.: US 7,973,467 B2
(45) Date of Patent: Jul. 5, 2011

(54) ORGANIC LIGHT EMITTING DEVICE

(75) Inventors: Won-Jun Song, Suwon-si (KR); Yeun-Joo Sung, Suwon-si (KR); Mu-Hyun Kim, Suwon-si (KR); Boris Kristal, Suwon-si (KR); Nam-Choul Yang, Suwon-si (KR); Seung-Wook Chang, Suwon-si (KR); Sun-Hee Lee, Suwon-si (KR)

(73) Assignee: Samsung Mobile Display Co., Ltd., Nongseo-Dong, Giheung-Gu, Yongin, Gyunggei-Do (KR)

( * ) Notice: Subject to any disclaimer, the term of this patent is extended or adjusted under 35 U.S.C. 154(b) by 404 days.

(21) Appl. No.: 12/133,712

(22) Filed: Jun. 5, 2008

(65) Prior Publication Data
US 2009/0128012 A1    May 21, 2009

(30) Foreign Application Priority Data

Nov. 15, 2007   (KR) .................. 10-2007-0116759

(51) Int. Cl.
*H01L 51/52* (2006.01)
(52) U.S. Cl. ....................... 313/504; 428/690
(58) Field of Classification Search .......... 428/690; 313/504
See application file for complete search history.

(56) References Cited

U.S. PATENT DOCUMENTS

| 6,396,209 | B1 * | 5/2002 | Kido et al. ........... 313/504 |
| 7,195,829 | B2 | 3/2007 | Cosimbescu et al. |
| 7,297,417 | B2 | 11/2007 | Kim et al. |
| 7,750,560 | B2 | 7/2010 | Yamazaki et al. |
| 2002/0024293 | A1 * | 2/2002 | Igarashi et al. ........... 313/483 |
| 2004/0178720 | A1 | 9/2004 | Lee et al. |
| 2004/0207318 | A1 | 10/2004 | Lee et al. |
| 2005/0062406 | A1 | 3/2005 | Kinoshita |
| 2005/0221119 | A1 | 10/2005 | Cosimbescu et al. |
| 2006/0008670 | A1 | 1/2006 | Lin et al. |
| 2006/0008740 | A1 | 1/2006 | Kido et al. |
| 2006/0279190 | A1 | 12/2006 | Nakayama |
| 2006/0286405 | A1 | 12/2006 | Begley et al. |
| 2006/0292394 | A1 | 12/2006 | Iwaki et al. |
| 2007/0020483 | A1 | 1/2007 | Park et al. |
| 2007/0075637 | A1 | 4/2007 | Kim et al. |
| 2007/0090756 | A1 | 4/2007 | Okada et al. |

(Continued)

FOREIGN PATENT DOCUMENTS

EP    1 603 174    12/2005

(Continued)

OTHER PUBLICATIONS

Extended European Search Report issued by the European Patent Office on Feb. 11, 2009.

(Continued)

*Primary Examiner* — D. Lawrence Tarazano
*Assistant Examiner* — J. L. Yang
(74) *Attorney, Agent, or Firm* — Robert E. Bushnell, Esq.

(57) ABSTRACT

An organic light emitting device includes an electron transport layer including an electron transport material and a metallic compound represented by Formula 1:

$$X_a Y_b \qquad \text{Formula 1:}$$

wherein X is an alkaline metal, an alkaline earth metal, or a transition metal, and Y is one of a Group 7 element and an organic group C1-C20, and a is an integer within the range of 1 to 3, and b is an integer within the range of 1 to 3.

20 Claims, 9 Drawing Sheets

U.S. PATENT DOCUMENTS

| | | |
|---|---|---|
| 2007/0126348 A1 | 6/2007 | Iou |
| 2007/0150206 A1 | 6/2007 | Iwaki et al. |
| 2007/0170843 A1 | 7/2007 | Kawamura et al. |
| 2007/0181876 A1 | 8/2007 | Itai |
| 2007/0210303 A1 | 9/2007 | Ikeda et al. |
| 2007/0222376 A1 | 9/2007 | Ohsawa et al. |
| 2009/0128024 A1 | 5/2009 | Fukuoka et al. |
| 2009/0167159 A1 | 7/2009 | Song et al. |
| 2009/0167160 A1 | 7/2009 | Song et al. |
| 2009/0212688 A1 | 8/2009 | Song et al. |
| 2009/0218934 A1 | 9/2009 | Song et al. |

FOREIGN PATENT DOCUMENTS

| | | |
|---|---|---|
| EP | 1 617 493 | 1/2006 |
| EP | 1 631 125 | 3/2006 |
| EP | 1 748 504 | 1/2007 |
| EP | 1 748 505 | 1/2007 |
| JP | 2000-182774 | 6/2000 |
| JP | 2000-215984 | 8/2000 |
| JP | 2003-264083 | 9/2003 |
| JP | 2004-172149 | 6/2004 |
| JP | 2004-296403 | 10/2004 |
| JP | 2004-319424 | 11/2004 |
| JP | 2004-355975 | 12/2004 |
| JP | 2006-128097 | 5/2006 |
| JP | 2006-156344 | 6/2006 |
| JP | 2006-269819 | 10/2006 |
| JP | 2007-005784 | 1/2007 |
| JP | 2007-36175 | 2/2007 |
| JP | 2007-134677 | 5/2007 |
| JP | 2007-208217 | 8/2007 |
| JP | 2007-287676 | 11/2007 |
| JP | 2007-531316 | 11/2007 |
| KR | 10-0263754 | 5/2000 |
| KR | 10-2005-0015902 | 2/2005 |
| KR | 10-2005-0115472 | 12/2005 |
| KR | 10-2006-0007899 | 1/2006 |
| KR | 10-2006-0042177 | 5/2006 |
| KR | 10-2006-0133521 | 12/2006 |
| KR | 10-2006-0135801 | 12/2006 |
| KR | 10-2007-0013002 | 1/2007 |
| KR | 10-0672535 | 1/2007 |
| KR | 10-698300 | 3/2007 |
| KR | 10-2007-0071978 | 7/2007 |
| KR | 10-2007-0077617 | 7/2007 |
| KR | 10-2007-0117200 | 12/2007 |
| WO | WO 2004/028217 | 4/2004 |
| WO | WO 2006/109878 | 10/2006 |
| WO | WO 2007/123061 | 11/2007 |

OTHER PUBLICATIONS

Japanese Office Action dated Sep. 7, 2010, issued in corresponding Japanese Patent Application No. 2008-278415.
Office Action issued by the Korean Intellectual Property Office on Apr. 24, 2009.
US Office Action dated Apr. 5, 2010, issued in corresponding U.S. Appl. No. 12/133,802.
US Office Action dated Sep. 3, 2010, issued in corresponding U.S. Appl. No. 12/133,802.
US Office Action dated Nov. 5, 2010, issued in corresponding U.S. Appl. No. 12/133,802.
US Office Action dated Jul. 9, 2010, issued in corresponding U.S. Appl. No. 12/133,824.
US Office Action dated Jul. 12, 2010, issued in corresponding U.S. Appl. No. 12/133,843.
US Office Action dated Jul. 15, 2010, issued in corresponding U.S. Appl. No. 12/133,744.
Walzer, K. et al. "Highly Efficient Organic Devices Based on Electrically Doped Transport Layers." *Chemical Review, American Chemical Society*, vol. 107, pp. 1233-1271, Jan. 1, 2007.
European Search Report dated Jan. 28, 2009, issued in corresponding European Patent Application No. 08253107.0.
European Communication dated Apr. 29, 2009, issued in corresponding European Patent Application No. 08254128.5.
Japanese Office Action dated Sep. 28, 2010, issued in corresponding Japanese Patent Application No. 2008-276076.
Japanese Office Action dated Sep. 28, 2010, issued in corresponding Japanese Patent Application No. 2008-276076.
Japanese Office Action dated Sep. 28, 2010, issued in corresponding Japanese Patent Application No. 2008-270210.
Korean Office Action dated Dec. 29, 2008, issue in corresponding Korean Patent Application No. 10-2008-6472618.
Korean Registration Determination Certificate dated Mar. 13, 2009, issued in corresponding Korean Patent Application No. 10-2007-0140554.
Korean Registration Determination Certificate dated Apr. 28, 2009, issued in corresponding Korean Patent Application No. 10-2008-0020077.
Korean Registration Determination Certificate dated Aug. 19, 2009, issued in corresponding Korean Patent Application No. 10-2007-0136406.
Korean Registration Determination Certificate dated Sep. 29, 2009, issued in corresponding Korean Patent Application No. 10-2009-040241095.
Korean Registration Determination Certificate dated Sep. 30, 2009, issued in corresponding Korean Patent Application No. 10-2009-040783883.
U.S. Appl. No. 12/133,802, filed Jun. 5, 2008, Won-jun Song, Samsung Mobile Display Co., Ltd.
U.S. Appl. No. 12/133,824, filed Jun. 5, 2008, Won-jun Song, Samsung Mobile Display Co., Ltd.
U.S. Appl. No. 12/133,843, filed Jun. 5, 2008, Won-jun Song, Samsung Mobile Display Co., Ltd.
U.S. Appl. No. 12/133,744, filed Jun. 5, 2008, Won-jun Song, Samsung Mobile Display Co., Ltd.
U.S. Appl. No. 12/211,224, filed Sep. 16, 2008, Won-jun Song, Samsung Mobile Display Co., Ltd.
U.S. Appl. No. 12/211,233, filed Sep. 16, 2008, Won-jun Song, Samsung Mobile Display Co., Ltd.

* cited by examiner

US 7,973,467 B2

ORGANIC LIGHT EMITTING DEVICE

CROSS-REFERENCE TO RELATED APPLICATION

This application claims the benefit of Korean Application No. 2007-116759, filed Nov. 15, 2007, in the Korean Intellectual Property Office, the disclosure of which is incorporated herein by reference.

BACKGROUND OF THE INVENTION

1. Field of the Invention

Aspects of the present invention relate to an organic light emitting device, and more particularly, to an organic light emitting device with improved driving voltage, light-emitting efficiency and lifetime by enhancing the electron injection abilities by incorporating a novel material for forming an electron transport layer.

2. Description of the Related Art

Organic light-emitting devices are self-emissive display devices that have drawn a large amount of attention due to a wide viewing angle, superior contrast, and quick response time.

An organic light emitting device typically comprises an anode, a cathode, and an organic light emitting layer between the anode and the cathode. As a non-limiting example, an organic light emitting device may be produced by forming an anode composed of a transparent conducting material such as ITO (indium tin oxide) on a glass substrate, and depositing a hole injection layer, a hole transport layer, an emission layer, an electron transport layer, and a cathode thereon.

In the organic light emitting device composed of deposited layers as described above, when direct-current voltage is applied between the anode and the cathode, a hole is injected from the anode, and electrons are injected from the cathode. The hole is transported to the emission layer through the hole injection layer and the hole transport layer, and electrons are transported to the emission layer through the electron transport layer. Then, light is emitted through the recoupling of the holes and the electrons in the emission layer.

A material such as tris-8-hydroxyquinolato aluminum (Alq3) is generally used to form the electron transport layer. However, when an electron transport layer is formed using electron transport materials known to date, the voltage typically must be increased to achieve a given luminance due to barriers formed during electron injection. Therefore, the development of a new electron transport material is desirable.

SUMMARY OF THE INVENTION

Aspects of the present invention provide an organic light emitting device which has improved driving voltage characteristics, light-emitting efficiency, and lifetime in addition to a reduced power consumption, due to a reduction in the voltage required to obtain a given luminance as a result of having enhanced electron injection abilities.

According to an embodiment of the present invention, there is provided an organic light emitting device comprising an electron transport layer comprising a first electron transport material and a metallic compound represented by Formula 1 below:

$$X_a Y_b \qquad \text{Formula 1:}$$

wherein X is an alkaline metal, an alkaline earth metal, or a transition metal; Y is one of the Group 7 elements or a C1-C20 organic group; a is an integer within the range of 1 to 3; and b is an integer within the range of 1 to 3.

According to another embodiment of the present invention, there is provided an organic light emitting device comprising a first electron transport layer comprising a first transport material; and a second electron transport layer comprising a second transport material and a metallic compound as represented by Formula 1 below:

$$X_a Y_b \qquad \text{Formula 1}$$

wherein X is an alkaline metal, an alkaline earth metal, or a transition metal; Y is one of the Group 7 elements or an organic group C1-C20; a is an integer within the range of 1 to 3; and b is an integer within the range of 1 to 3.

The organic light emitting device according to aspects of the present invention has a structure that includes a first electrode, a hole injection layer, an emission layer, and a second electrode, in addition to the electron transport layer as described. Furthermore, the organic light emitting device according to aspects of the present invention has a structure that includes a first electron transport layer and a second electron transport layer forming a two-layered structure, a hole injection layer and an emission layer, between a first electrode and a second electrode. The organic light emitting device according to aspects of the present invention may also include another hole injection layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
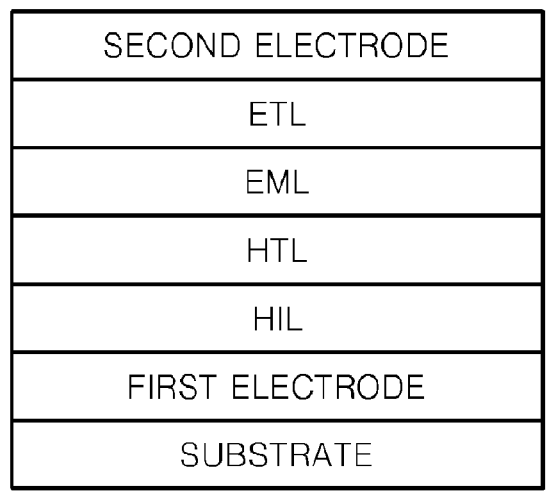
FIG. 1 is a diagram illustrating the depositing structure of the organic light emitting device according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Charge balance in an emission layer is very important in implementing a highly efficient organic light emitting device. In a structure where multiple carriers are holes (+), it is desirable to control the charge flow density of electrons (−). To this end, according to aspects of the present invention, a metallic compound represented by Formula 1 below and an electron transport material are used to form the electron transport layer:

$$X_a Y_b \quad \text{Formula 1}$$

wherein X is an alkaline metal, an alkaline earth metal, or a transition metal; Y is a Group 7 element or a C1-C20 organic group; a is an integer within the range of 1 to 3; and b is an integer within the range of 1 to 3.

As a non-limiting example, X of Formula 1 may be lithium, cesium, sodium, barium, magnesium, or ytterbium, and Y may be quinolate, acetoacetate, or a halide.

As a non-limiting example, the metal compound represented by Formula 1 above may be lithium quinolate, sodium quinolate, lithium acetoacetate, magnesium acetoacetate, lithium fluoride, cesium fluoride, or sodium fluoride.

The amount of the metallic compound represented by Formula 1 may be 20 to 60 parts by weight, and in particular, 25 to 50 parts by weight based on 100 parts by weight of the electron transport layer (ETL). The amount of the electron transport material may be 40 to 80 parts by weight based on 100 parts by weight of the ETL, and in particular, 50 to 75 parts by weight. If amount of the metallic compound of Formula 1 is less than the range given above, the additional effects provided by the presence of the metallic compound may be minute.

The organic light emitting device according to aspects of the present invention does not require a separate electron injection layer to facilitate the injection of electrons.

Furthermore, in addition to the ETL described above, the organic light emitting device may further include another ETL that comprises an electron transport material with an electron mobility greater than or equal to $10^{-8}$ cm/V at an electric field of 800-1000 $(V/cm)^{1/2}$. For example, the organic light emitting device according to aspects of the present invention may include a first electron transport layer (ETL1) comprising a first electron transport material, and a second electron transport layer (ETL2) comprising a second electron transport material and a metallic compound represented by Formula 1.

When such a double-layered structure of the ETL is provided, a much more coordinated electron injection is possible, compared to using a single-layered ETL. Consequently, the power consumption is significantly decreased due to a decrease in the voltage required for a given luminance.

In the ETL2, the relative amount of the metallic compound and the second electron transport material may be the same as those in a single-layer ETL. In particular, the amount of the metallic compound represented by Formula 1 may be 20-60 parts by weight, and in particular, 25-50 parts by weight, based on 100 parts by weight of the ETL2. The amount of the second electron transport material may be 40-80 parts by weight, and in particular, 50-75 parts by weight based on 100 parts by weight of the ETL2.

The first electron transport material has an electron mobility of greater than or equal to $10^{-8}$ cm/V. As a non-limiting example, the electron mobility of the first electron transport material may be $10^{-4}$-$10^{-8}$ cm/vs at an electric field of 800-1000 $(V/cm)^{1/2}$. Specific examples of the first electron transport material include bis(10-hydroxybenzo[h]quinoline beryllium (Bebq2), 8-hydroxyquinoline zinc (Znq2) or (8-hydroxyquinoline) aluminum (Alq3).

The second electron transport material may have the same electron mobility as the first electron transport material in the ETL1 (greater than or equal to $10^{-8}$ cm/V) and the first and second electron transport materials may have the same or different compositions. For example, providing a first electron transport material and a second electron transport material having the same composition is advantageous from a charge mobility perspective. The thickness ratio of the ETL1 and the ETL2 may be 1:1 to 2:1.

Figure 2:
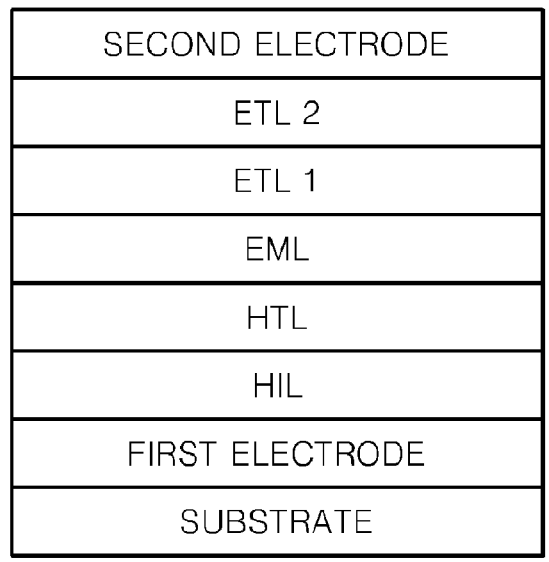
FIG. 2 is a diagram illustrating the depositing structure of the organic light emitting device according to another embodiment of the present invention.

The organic light emitting devices according to embodiments of the present invention may have a deposited structure as shown in FIG. 1 or as shown in FIG. 2.

With reference to FIG. 1, the first electrode, a hole injection layer (HIL), and a hole transport layer (HTL) are respectively formed on the substrate. The HIL can be omitted if desired. On the exposed side of the HTL, an emission layer (EML) and the ETL comprising the electron transport material and the metallic compound represented by the previously mentioned Formula 1 are formed. Bebq2 and LiF are non-limiting examples of the electron transport material and the metallic compound of Formula 1, respectively. The second electrode is deposited on the exposed side of the ETL.

The organic light emitting device shown in FIG. 2 may be formed in the same manner as the organic light emitting device of FIG. 1, except that first and second electron transport layers are formed. With reference to FIG. 2, the first electrode, HIL, and HTL are respectively formed on the substrate. The HIL can be omitted if desired. On the exposed side of the HTL, the emission layer (EML), a first electron transport layer (ETL1) including a first electron transport material, and a second electron transport layer (ETL2) including a second electron transport material and the metallic compound represented by the above mentioned Formula 1, are formed, and the second electrode is stacked on the exposed side of the ETL2.

In the organic light emitting device having a deposited structure as shown in FIG. 2, ETL1 has a role of controlling the charge movement rate, and ETL2 has a role of lowering the electron injection barrier.

As non-limiting examples, the first electron transport material of ETL1 may be Bebq2, Alq3, or Znq2.

ETL2 comprises the second electron transport material and a dielectric metallic compound represented by Formula 1.

As non-limiting examples, for the metallic compounds, LiF, BaF, CsF, NaF, or 8-quinolato lithium (Liq) may be used, and for the second electron transport material, Bebq2, Znq2, or Alq3 may be used.

As shown in FIGS. 1 and 2, an electron injection layer is not necessary for the organic light emitting device of the present invention.

Hereinafter, the method of producing the organic light emitting device according to an embodiment of the present invention is described in greater detail. First, a material for the first electrode, which is an anode, is deposited on the top side of the substrate to form the anode. The substrate may comprise any material commonly used for an organic light-emitting device. For example, the substrate may be a glass substrate or a transparent plastic substrate with superior transparency, surface flatness, ease of use, and waterproof properties. For the anode material, transparent and highly-conductive materials such as indium tin oxide (ITO), indium zinc oxide (IZO), tin oxide ($SnO_2$), and zinc oxide (ZnO) may be used.

A hole injection material is vacuum-heat evaporated or spin-coated onto the anode to form the HIL selectively. As non-limiting examples of the hole injection material, a phthalocyanine compound such as copper phthalocyanine that has a published description in U.S. Pat. No. 4,356,429, or star-burst-type amine derivatives described in *Advanced Material*, vol. 6, p. 677 (1994) such as TCTA, m-MTDATA, or m-MT- DAPB, may be used. The thickness of the HIL may be in a range of 2 nm-100 nm. Within this range, 10 nm may be selected, as a particular, non-limiting example. If the thickness of the HIL is less than 2 nm, the HIL may be too thin to achieve hole injection, and if the thickness of the HIL exceeds 100 nm, the conductivity of the HIL may decline.

On the exposed side of the HIL, the HTL may be formed from hole transport material through methods such as vacuum deposition, spin-coating, casting, or a Langmuir-Blodgett (LB) technique. For example, vacuum deposition may be used because a uniform film can easily be obtained and pin holes do not easily develop. When using vacuum deposition to form the HTL, the deposition conditions may vary according to the compound used, but are generally selected to be similar to the deposition conditions used in the formation of the HIL. The material of the HTL is not limited to any particular material. As non-limiting examples, N,N'-bis(3-methylphenyl)-N,N'-diphenyl-[1,1-biphenyl]-4,4'diamine (TPD) and N,N'-di-(naphthalene-1-yl)-N,N'-diphenyl benzidine (α-NPD) may be used.

Subsequently, the emission layer is introduced on the exposed side of the HTL. Vacuum deposition, spin-coating, casting, an LB technique and the like may be used to form the emission layer. The material used for the emission layer is not limited to any particular material. As non-limiting examples, as the material for the emission layer, oxadiazole dimer dyes (Bis-DAPOXP), spiro compounds (Spiro-DPVBi, Spiro-6P), triarylamine compounds, bis(styryl)amines (DPVBi, DSA), 4,4'-bis(9-ethyl-3-carbazovinylene)-1,1'-biphenyl (BCz-VBi), perylene, 2,5,8,11-tetra-tert-butylperylene (TPBe), 9H-carbazole-3,3'-(1,4-phenylene-di-2,1-ethene-diyl)-bis-[9-ethyl-(9C)] (BCzVB), 4,4'-bis[4-(di-p-tolylamino)-styryl]-biphenyl (DPAVBi), 4-(di-p-tolylamino)-4'-[di-p-tolylamino]styryl]stilbene (DPAVB), 4,4'-bis[4-(diphenylamino)styryl]biphenyl (B DAVBi), bis(3,5-difluoro-2-(2-pyridyl)phenyl-(2-carboxypyridyl)iridium III (FIrPic) etc. may be used for a blue emission layer; 3-(2-benzothiazolyl)-7-(diethylamino)coumarin (Coumarin 6), 2,3,6,7-tetrahydro-1,1,7,7-tetramethyl-1H,5H,11H-10-(2-benzothiazolyl)quinolizino-[9,9a,1gh]coumarin (C545T), N,N'-dimethyl-quinacridone (DMQA), tris(2-phenyl pyridine) iridium(III) (Ir(ppy)$_3$) may be used for a green emission layer; and tetraphenyl naphthacene (Rubrene), tris(1-phenyl-isoquinoline) iridium(III) (Ir(piq)$_3$), bis(2-benzo[b]thiophene-2-yl-pyridine acetylacetonate iridium(III) (Ir(btp)$_2$ (acac)), tris(dibenzoylmethane)phenanthroline europium(III) (Eu(dbm)$_3$(phen)), tris[4,4'-di-tert-butyl-(2, 2')-bipyridine]ruthenium(III) complex (Ru(dtb-bpy)3*2 (PF6)), DCM1, DCM2, Eu(thenoyltrifluoroacetone)$_3$ (Eu (TTA)$_3$), butyl-6-(1,1,7,7-tetramethyljulolidyl-9-enyl)-4H-pyran (DCJTB) and the like may be used for a red emission layer. Moreover, for a high-molecular luminescent material, high molecules such as phenylenes, phenylene vinylenes, thiophenes, fluorenes, and spiro-fluorenes and nitrogen-containing aromatic compounds can be included, but are not limited thereto.

The thickness of the emission layer may be 10 nm to 500 nm, and preferably 50 nm to 120 nm. As a specific, non-limiting example, the thickness of the blue emission layer may be 70 nm. If the thickness of the emission layer is less than 10 nm, the leakage current may increase, thereby decreasing the efficiency and the lifetime of the light emitting device, and if the thickness of the emission layer is higher than 500 nm, the rate of increase of the driving voltage may increase, which is not desirable.

In some cases an emission dopant may be added to the emission layer host material when producing the emission layer. As non-limiting examples, tris-(8-hydroxy-quinolinato) aluminum (Alq3), 9,10-di(naphthy-2-yl)anthracene (ADN), 3-tert-butyl-9,10-di(naphthy-2-yl)anthracene (TBADN), 4,4'-bis(2,2-diphenyl-ethen-1-yl)-4,4'-dimethylphenyl (DPVBi), 4,4'-bis(2,2-diphenyl-ethen-1-yl)-4,4'-dimethylphenyl (p-DMDPVBi), tert-9,9-diarylfluorenes (TDAF), 2-(9,9'-spirobifluoren-2-yl)-9,9'-spirobifluorene (BSDF), 2,7-bis(9,9'-spirobifluoren-2-yl)-9,9'-spirobifluorene (TSDF), bis-9,9-diarylfluorenes (BDAF), 4,4'-bis(2,2-diphenyl-ethen-1-yl)-4,4'-di-(tert-butyl)phenyl (p-TDBVBi) and the like may be used as a fluorescent emission host material, and 1,3-bis(carbazol-9-yl)benzene (mCP), 1,3,5-tris-(carbazol-9-yl)benzene (tCP), 4,4',4''-tris(carbazol-9-yl) triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9'-bis(9-phenyl-9H-carbazole) fluorene (FL-4CBP), 4,4'-bis(carbazol-9-yl)-9,9'-di-tolyl-fluorene (DPFL-CBP), 9,9-bis(9-phenyl-9H-carbazole) fluorene (FL-2CBP) and the like may be used as a phosphorescent host material.

The dopant content may vary depending on the emission layer-forming material, but generally, based on 100 parts by weight of the emission layer-forming material (total weight of the host and dopant), the dopant content may be 3-80 parts by weight. If the dopant content goes beyond this range, the emission properties of the EL device may be diminished. As a specific, non-limiting example, DPAVBi (4,4'-bis[4-(di-p-tolylamino)-styryl]-biphenyl) may be used for the dopant, and ADN (9,10-di(naphthy-2-yl)anthracene) or TBADN (3-tert-butyl-9,10-di(naphthy-2-yl)anthracene) may be used for the phosphorescent host (See compounds below).

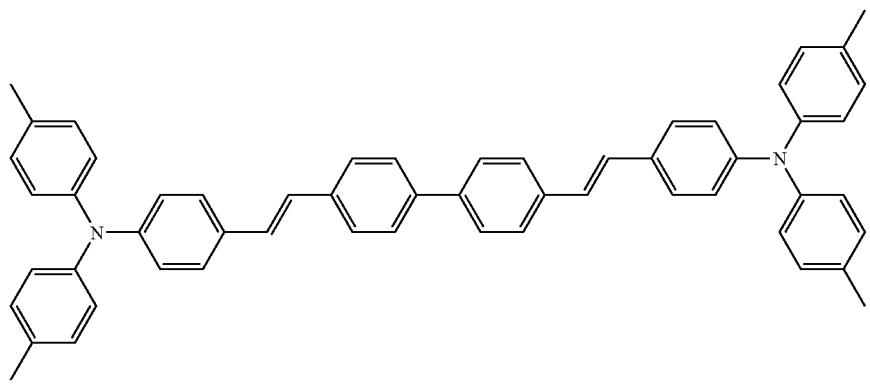

DPAVBi

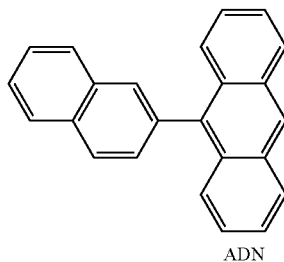

ADN

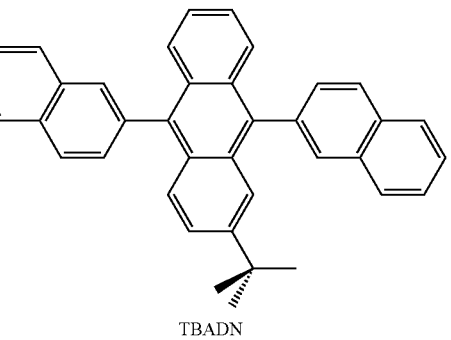

TBADN

Next, the ETL is formed by depositing the electron transport material and the metallic compound represented by the above mentioned Formula 1 through vacuum deposition. For the electron transport material, an electron transport material having an electron mobility of more than $10^{-8}$ cm/V, and in particular, $10^{-3}$ to $10^{-8}$ cm/V at an electric field of 800-1000 $(V/cm)^{1/2}$ may be used. If the electron mobility of the ETL is less than $10^{-8}$ cm/V, the rate of electron injection into the emission layer may not be sufficient, which is an undesirable situation in terms of charge balance.

For the ETL-forming material, bis(10-hydroxebenzo[h]quinolinato beryllium (Bebq2) as represented by Formula 2 below, its derivatives, 8-hydroxyquinoline Zinc (Znq2) or (8-hydroxyquinoline) aluminum (Alq3) may be used.

Formula 2

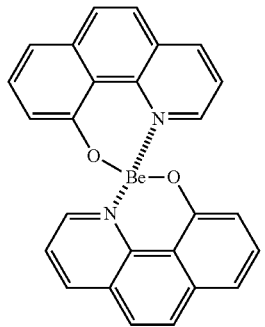

While aspects of the present invention provide a superior electron injection capability without an electron injection layer being formed therein, depositing an electron injection layer made of a material that functions to facilitate the electron injection from the cathode to ETL significantly improves the electron injection capability.

Materials for forming the electron injection layer may be LiF, NaCl, CsF, Li$_2$O, BaO, and the like. The deposition conditions of the ETL and the electron injection layer may vary depending on the compounds used, but deposition conditions are generally selected to be similar to the deposition conditions used in formation of the HIL.

Finally, a second electrode (the cathode) is formed by vacuum deposition or sputter deposition of a metal suitable for forming a cathode on the exposed side of the electron injection layer. Materials that may be used to form the cathode include metals, alloys, electric conductive compounds or their mixtures having a low work function. Lithium (Li), magnesium (Mg), aluminum (Al), aluminum-lithium (Al—Li), calcium (Ca), magnesium-indium (Mg—In), magnesium-silver (Mg—Ag) and the like are specific examples of cathode materials. Moreover, in order to obtain a front panel emission device, transmission-type cathodes using ITO and IZO may be used.

The method of producing the organic light emitting device according to another embodiment of the present invention will now be described. As shown in FIG. 2, an organic light emitting device that includes a double-layered ETL is produced using the same method as previously described for producing the organic light emitting device comprising a single ETL, except that the first electron transport material is deposited on the exposed side of the EML by vacuum deposition to form the ETL1, and then the second electron transport material and the metallic compound represented by the above mentioned Formula 1 is deposited on the exposed side of the ETL1 by vacuum deposition to form the ETL2.

Aspects of the present invention are described through the embodiments below, but the invention is not limited thereto.

Example 1

Production of the Organic Light Emitting Device

For the anode, a Corning 15 $\Omega/cm^2$ (1200 Å) ITO glass substrate was cut into a size of 50 mm×50 mm×0.7 mm and washed by sonicating in isopropyl alcohol and deionized water for 5 minutes each, and then treated with UV ozone for 30 minutes.

On the top surface of the substrate, an HIL having a thickness of 5 nm was formed using copper phthalocyanine (CuPc).

On top of the HIL, an HTL was formed at a thickness of 60 nm by vacuum-depositing N,N'-bis(α-naphthyl)-N,N'-diphenyl-4,4'-diamine (NPB). After forming the HTL as mentioned, an emission layer was formed on top of the HTL by vacuum-depositing 100 parts by weight of Alq3 as a host and 10 parts by weight of coumarin 6 as a dopant.

Then, an ETL having a thickness of 35 nm was formed by vacuum-depositing 25 parts by weight of LiF and 75 parts by weight of Bebq2 on top of the emission layer.

Production of the organic light emitting device is completed by vacuum-depositing an aluminum electrode, as the cathode, to a thickness of 3000 Å on top of the ETL.

Example 2

Production of the Organic Light Emitting Device

The organic light emitting device was produced in the same manner as in Example 1, except that the ETL was formed by vacuum-depositing 50 parts by weight of lithium quinolate and 50 parts by weight of Bebq2.

Example 3

Production of the Organic Light Emitting Device

For the anode, a Corning 15 Ω/cm2 (1200 Å) ITO glass substrate was cut into a size of 50 mm×50 mm×0.7 mm and washed by sonicating in isopropyl alcohol and deionized water for 5 minutes each, and then washed in UV ozone for 30 minutes.

On the top surface of the substrate, an HIL having a thickness of 5 nm was formed using copper phthalocyanine (CuPc).

On top of the HIL, an HTL was formed at a thickness of 60 nm by vacuum-depositing NPB. After forming the HTL as mentioned, an emission layer was formed on top of the HTL by vacuum-depositing 100 parts by weight of Alq3 as a host and 10 parts by weight of coumarin 6 as a dopant.

Then, a first electron transport layer, ETL1, having a thickness of 10 nm was formed by vacuum-depositing Bebq2 on top of the emission layer.

A second electron transport layer, ETL2, having a thickness of 15 nm was formed by vacuum-depositing 25 parts by weight of LiF and 75 parts by weight of Bebq2 on top of the ETL1.

The production of the organic light-emitting device was completed by vacuum-depositing Al to a thickness of 3000 Å on top of the ETL2 to form the Al electrode, which is the cathode.

Example 4

Production of the Organic Light Emitting Device

The organic light emitting device was produced in the same manner as in Example 3, except that the ETL2 was formed by vacuum-depositing 50 parts by weight of lithium quinolate and 50 parts by weight of Bebq2.

Comparative Example 1

Production of the Organic Light Emitting Device

An organic light emitting device was produced in the same manner as in Example 1, except that $Alq_3$ was used when forming the ETL.

Comparison of the Organic Light Emitting Device of Example 1 and Comparative Example 1

Figure 3:
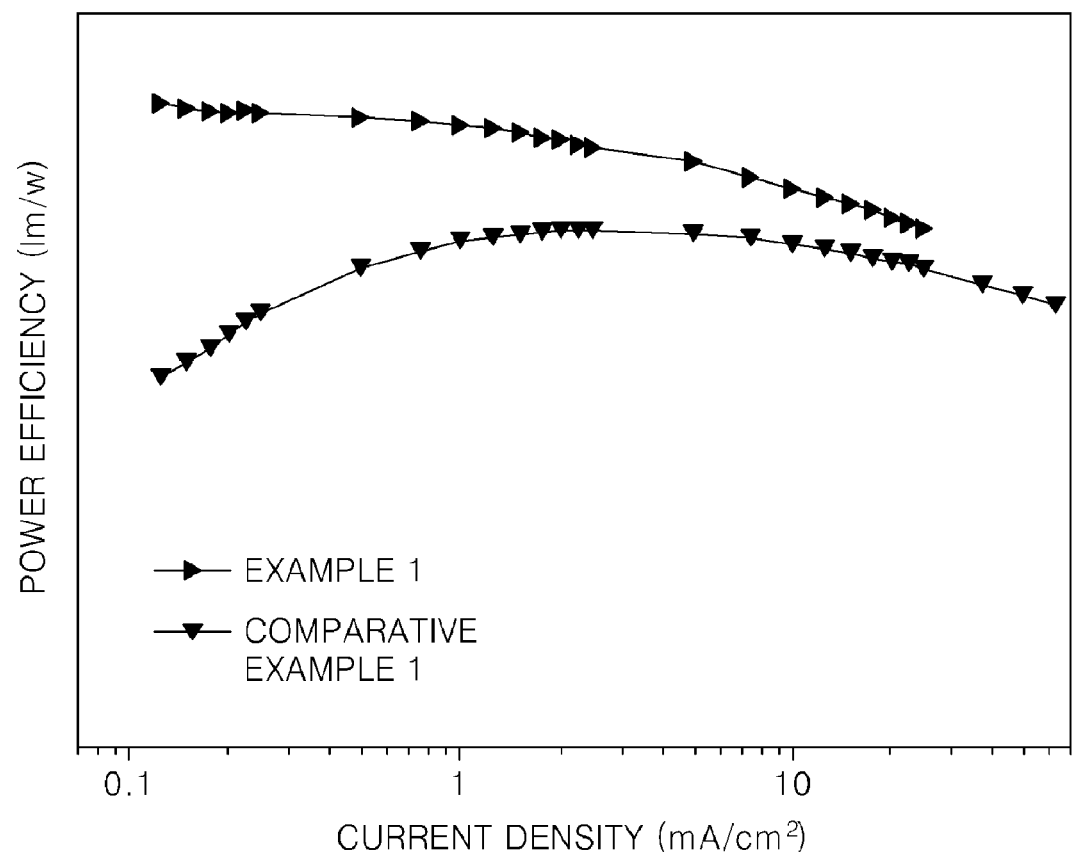
FIG. 3 is a graph illustrating the power efficiency with respect to the current density of the organic light emitting device of Example 1 and Comparative Example 1.

The power efficiency with respect to the current density of the organic light emitting device produced according to Example 1 and Comparative Example 1 was investigated. The results are shown in FIG. 3. In FIG. 3, it is shown that the power efficiency of the organic light emitting device in Example 1 is improved relative to the power efficiency of the organic light emitting device of Comparative Example 1.

Comparison of the Organic Light Emitting Device of Example 2 and Comparative Example 1

Figure 4:
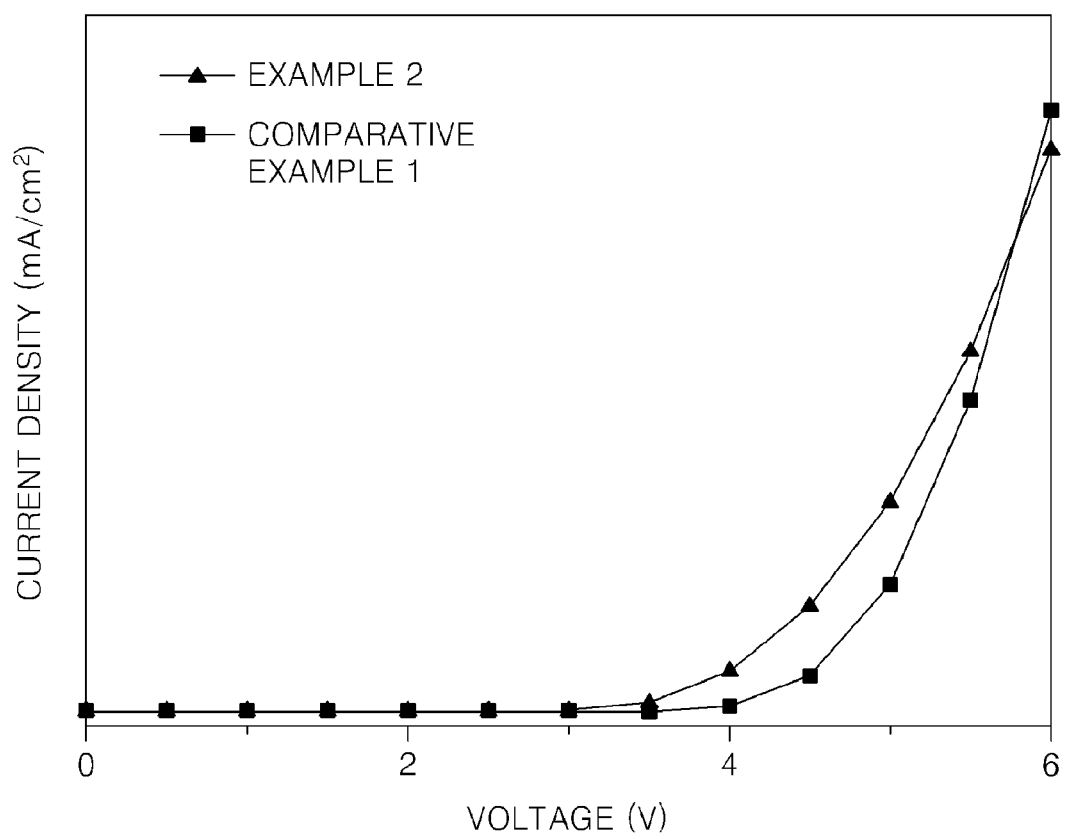
FIG. 4 is a graph illustrating the current density with respect to the voltage of the organic light emitting device of Example 2 and Comparative Example 1.
Figure 5:
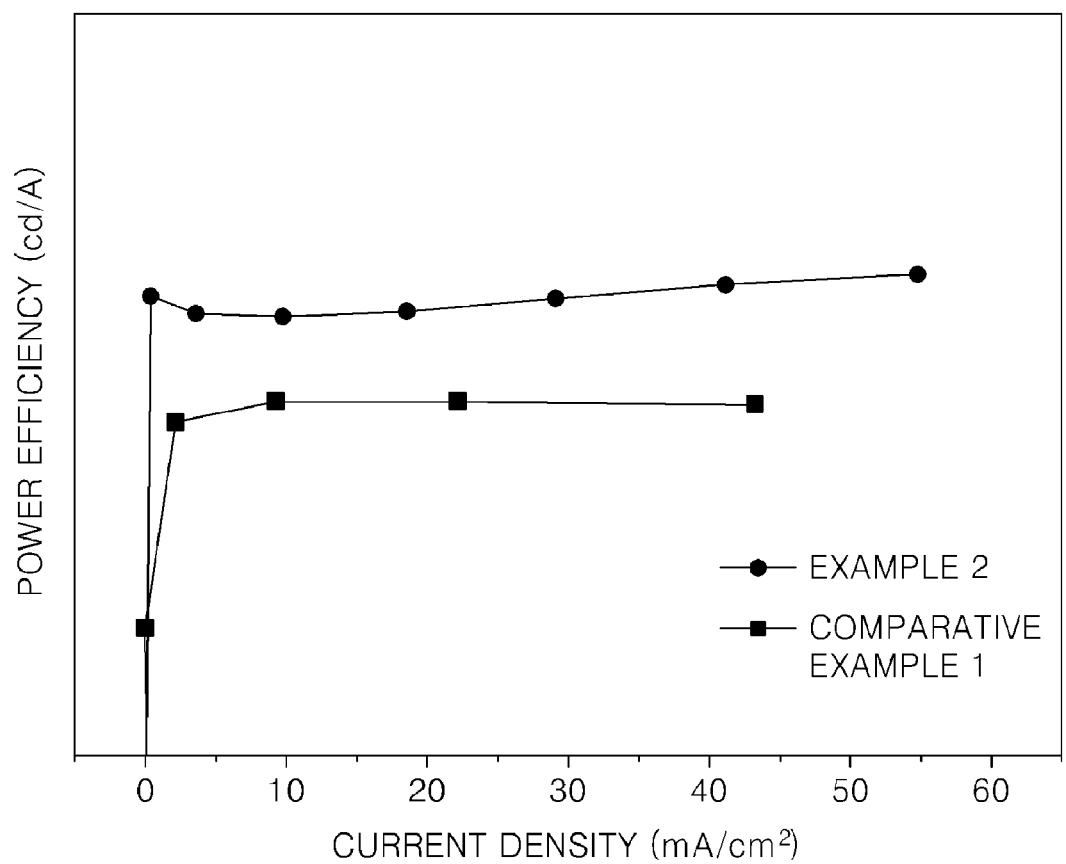
FIG. 5 is a graph illustrating the current efficiency with respect to the current density of the organic light emitting device of Example 2 and Comparative Example 1.

The current density with respect to the voltage and the current efficiency with respect to the current density of the organic light emitting devices produced according to Example 2 and Comparative Example 1 were measured, and the results are illustrated in FIGS. 4 and 5, respectively. In FIGS. 4 and 5, it is shown that the organic light-emitting device of Example 2 has enhanced current density and current efficiency characteristics compared to those of Comparative Example 1.

Comparison of the Organic Light Emitting Device of Example 3 and Comparative Example 1

Figure 6:
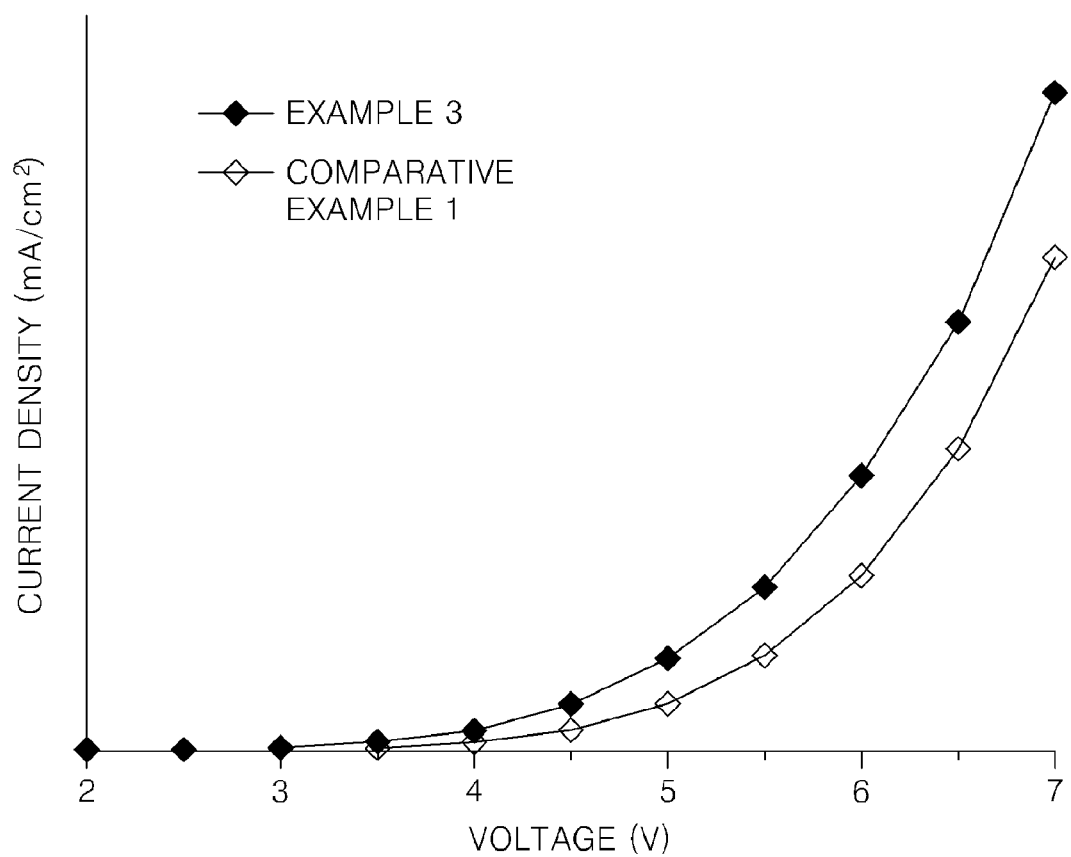
FIG. 6 is a graph illustrating the current density with respect to the voltage of the organic light emitting device of Example 3 and Comparative Example 1.
Figure 7:
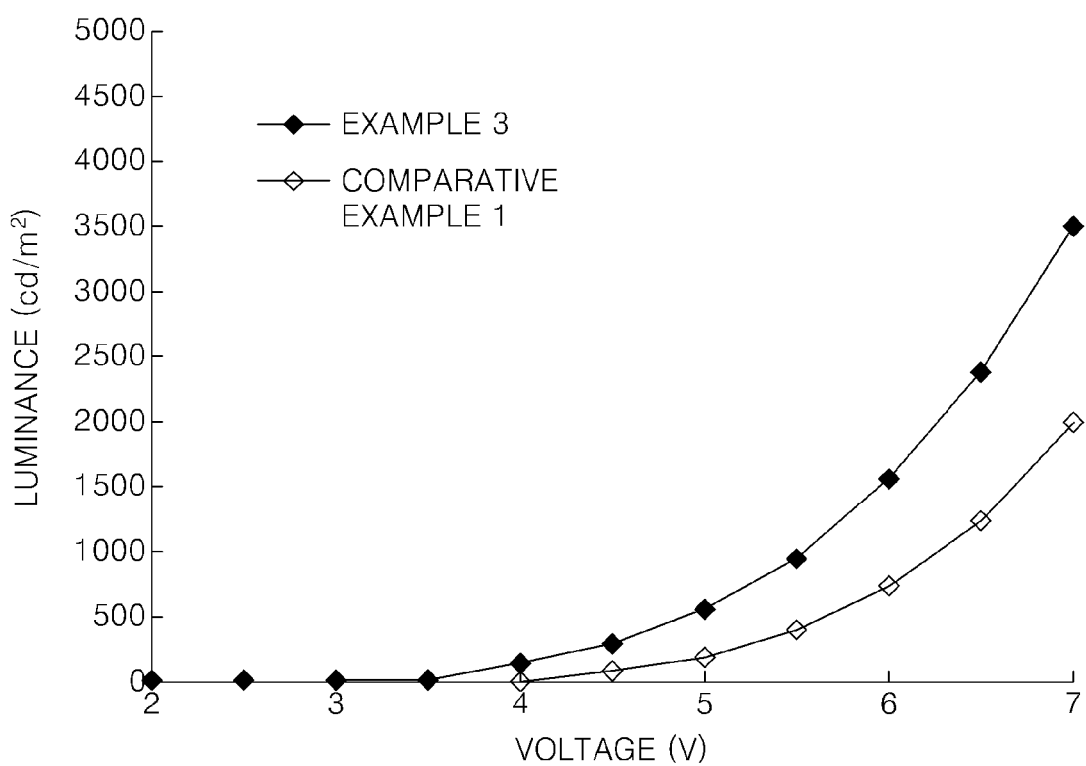
FIG. 7 is a graph illustrating the luminance with respect to the voltage of the organic light emitting device of Example 3 and Comparative Example 1.

The current density and luminance changes with respect to voltage of the organic light emitting devices produced according to Example 3 and Comparative Example 1 were measured, and the results are illustrated in FIG. 6 and FIG. 7, respectively. In FIGS. 6 and 7, it is shown that the organic light-emitting device of Example 3 has enhanced current density and luminance change characteristics compared to those of Comparative Example 1.

Comparison of the Organic Light Emitting Device of Example 4 and Comparative Example 1

Figure 8:
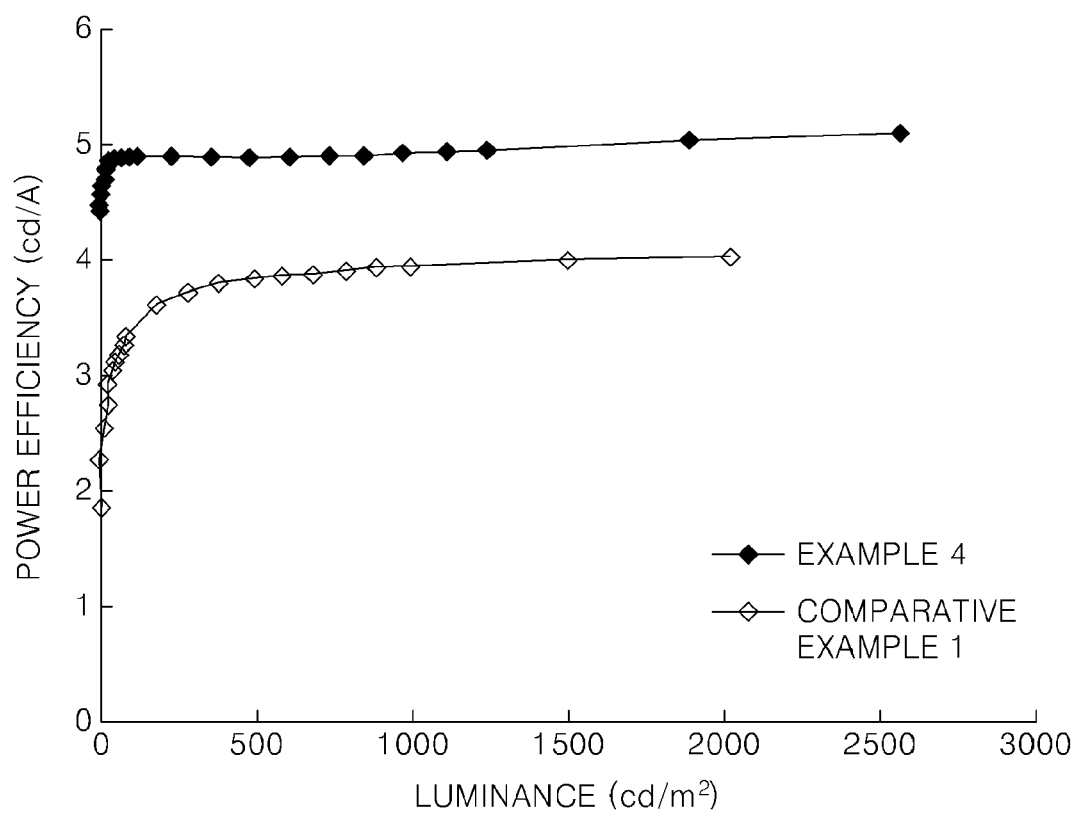
FIG. 8 is a graph illustrating the power efficiency with respect to the luminance of the organic light emitting device of Example 4 and Comparative Example 1.
Figure 9:
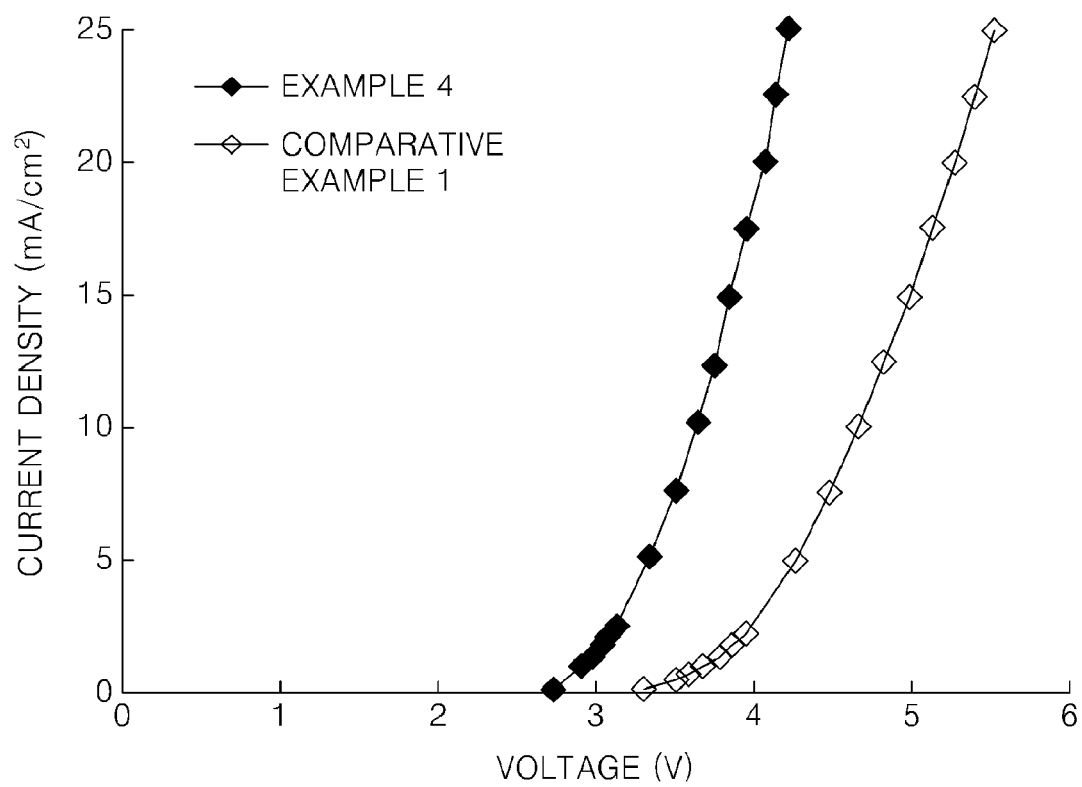
FIG. 9 is a graph illustrating the current density (V-I) with respect to the voltage of the organic light emitting device of Example 4 and Comparative Example 1.
Figure 10:
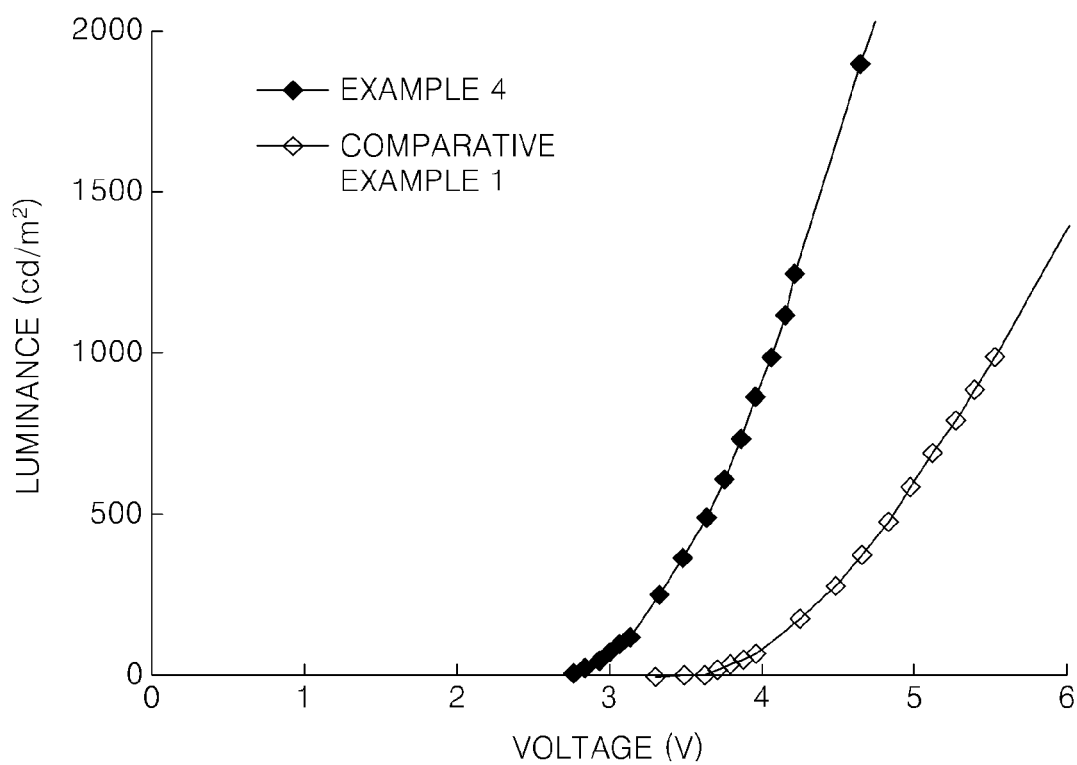
FIG. 10 is a graph illustrating the luminance (V-L) with respect to the voltage of the organic light emitting device of Example 4 and Comparative Example 1.

For the organic light emitting devices produced according to Example 4 and Comparative Example 1, efficiency with respect to luminance, current density with respect to voltage (V-I), and luminance with respect to voltage (V-L) were investigated and the results are each shown in FIG. 8 to FIG. 10. In FIG. 8 to FIG. 10, it is shown that the efficiency with respect to luminance, current density with respect to voltage (V-I), and luminance with respect to voltage (V-L) of the organic light emitting device of Example 4 are improved compared to the organic light emitting device of Comparative Example 1.

As described above, the organic light emitting device according to aspects of the present invention employs a novel material for forming an electron transport layer so that the electron injection properties are greatly improved without forming an electron injection layer. As a result, the current efficiency and power efficiency are enhanced compared to the current efficiency and power efficiency of organic light emitting devices utilizing commonly used electron transport materials, and the balance of charge injected into the emission layer is controlled such that the driving voltage and lifetime are improved. Moreover, a further advantage of the organic light emitting device according to aspects of the present invention is that the shortening of the life span is minimized during constant voltage drive.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting device which has an electron transport layer comprising an electron transport material and a metallic compound represented by Formula 1 below:

$$X_aY_b;\quad\quad\quad\text{[Formula 1]}$$

wherein X is selected from the group consisting of an alkaline metal, an alkaline earth metal, and a transition metal;

Y is selected from the group consisting of a Group 7 element and acetoacetate;

a is an integer within the range of 1 to 3; and b is an integer within the range of 1 to 3, and wherein an amount of the metallic compound is in the range of 20 to 60 parts by weight based on 100 parts by weight of the electron transporting material.

2. The organic light emitting device of claim 1, wherein X of Formula 1 is selected from the group consisting of Li, Cs, Na, Ba, Mg, and Yb.

3. The organic light emitting device of claim 1, wherein the metallic compound represented by Formula 1 is at least one compound selected from the group consisting of lithium acetoacetate, magnesium acetoacetate, lithium fluoride, cesium fluoride, and sodium fluoride.

4. The organic light emitting device of claim 1, wherein the electron mobility of the electron transport material is equal to or greater than $10^{-8}$ cm/V at an electric field of 800-1000 $(V/cm)^{1/2}$.

5. The organic light emitting device of claim 1, wherein the electron transport material comprises at least one compound selected from the group consisting of bis-(10-hydroxybenzo[h]quinolinato) beryllium (Bebq2) represented by Formula 2 below, derivatives thereof, 8-hydroxyquinoline zinc (Znq2) and 8-hydroxyquinoline aluminum (Alq3)

[Formula 2]

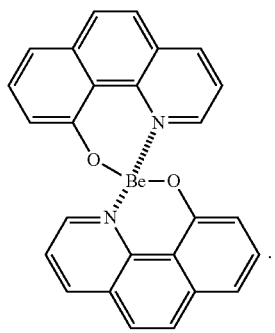

6. The organic light emitting device of claim 1, further comprising a first electrode, a hole transport layer, an emission layer, and a second electrode.

7. The organic light emitting device of claim 6, wherein the organic light emitting device further comprises a hole injection layer.

8. The organic light emitting device of claim 6, wherein the organic light emitting device further comprises an electron injection layer.

9. The organic light emitting device of claim 6, wherein the organic light emitting device does not include an electron injection layer.

10. An organic light emitting device comprising:
a first electron transport layer comprising a first electron transport material; and
a second electron transport layer comprising a second electron transport material and a metallic compound represented by Formula 1 below:

$$X_a Y_b$$ [Formula 1]

wherein X is selected from the group consisting of an alkaline metal, an alkaline earth metal, and a transition metal;
Y is selected from the group consisting of a Group 7 element and an acetoacetate;
a is an integer within the range of 1 to 3; and
b is an integer within the range of 1 to 3, and
wherein an amount of the second compound of the first electron transport layer is in the range of 30 to 50 parts by weight based on 100 parts by weight of the electron transporting material.

11. The organic light emitting device of claim 10, wherein the first electron transport material has an electron mobility that is equal to or greater than $10^{-8}$ cm/V at an electric field of 800-1000 $(V/cm)^{1/2}$.

12. The organic light emitting device of claim 10, wherein the first electron transport material has an electron mobility within the range of $10^{-4}$ to $10^{-8}$ cm/V at an electric field of 800-1000 $(V/cm)^{1/2}$.

13. The organic light emitting device of claim 10, wherein the thickness ratio between the first electron transport layer and the second electron transport layer is 1:1 to 2:1.

14. The organic light emitting device of claim 10, wherein the first electron transport material and the second electron transport material independently comprise one or more compounds selected from the group consisting of bis-(10-hydroxybenzo[h]quinolinato) beryllium (Bebq2) represented by Formula 2 below, derivatives thereof, 8-hydroxyquinoline zinc (Znq2) and 8-hydroxyquinoline aluminum (Alq3)

[Formula 2]

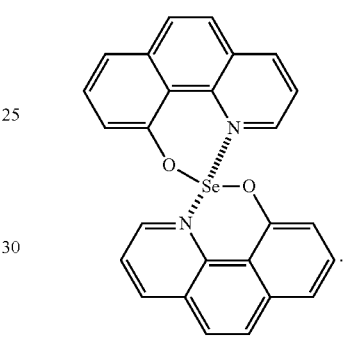

15. The organic light emitting device of claim 10, wherein X of Formula 1 is selected from the group consisting of Li, Cs, Na, Be, Mg, and Yb.

16. The organic light emitting device of claim 10, wherein Y of Formula 1 is selected from the group consisting of a fluoride (F), an acetoacetate, a chloride, and a bromide.

17. The organic light emitting device of claim 10, wherein the metallic compound represented by Formula 1 is at least one compound selected from the group consisting of lithium acetoacetate, magnesium acetoacetate, lithium fluoride, cesium fluoride, and sodium fluoride.

18. The organic light emitting device of claim 10, further comprising a first electrode, a hole transport layer, an emission layer, and a second electrode.

19. The organic light emitting device of claim 18, wherein the first electron transport layer is adjacent the emission layer and the second electron transport layer is between the first electron transport layer and the second electrode.

20. The organic light emitting device of claim 18, further comprising a hole injection layer.

* * * * *